(12) United States Patent
Panagis et al.

(10) Patent No.: US 11,927,657 B2
(45) Date of Patent: Mar. 12, 2024

(54) MULTIRESOLUTION MAGNETIC RESONANCE FINGERPRINTING SYSTEMS AND METHODS

(71) Applicant: REGENTS OF THE UNIVERSITY OF MICHIGAN, Ann Arbor, MI (US)

(72) Inventors: Kathleen Ropella Panagis, Superior Township, MI (US); Nicole Seiberlich, Ann Arbor, MI (US); Jesse Hamilton, Ann Arbor, MI (US)

(73) Assignee: REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 155 days.

(21) Appl. No.: 17/720,204

(22) Filed: Apr. 13, 2022

(65) Prior Publication Data

US 2023/0333189 A1 Oct. 19, 2023

(51) Int. Cl.
*G01R 33/561* (2006.01)
*G01R 33/50* (2006.01)
*G01R 33/56* (2006.01)

(52) U.S. Cl.
CPC .......... *G01R 33/561* (2013.01); *G01R 33/50* (2013.01); *G01R 33/5602* (2013.01)

(58) Field of Classification Search
CPC ... G01R 33/50; G01R 33/5602; G01R 33/561
See application file for complete search history.

(56) References Cited

U.S. PATENT DOCUMENTS

| 10,076,264 B2 * | 9/2018 | Brady-Kalnay ....... A61B 5/742 |
| 11,280,865 B2 * | 3/2022 | Eggers .............. G01R 33/5615 |
| 11,304,623 B2 * | 4/2022 | Altmann ................ A61B 6/584 |

OTHER PUBLICATIONS

Hamilton et al., Simultaneous multislice cardiac magnetic resonance fingerprinting using low rank reconstruction, NMR Biomed., 32(2):e4041 (2019).
Jiang et al., MR fingerprinting using fast imaging with steady state precession (FISP) with spiral readout, 74(6):1621-31 (2015).
Ma et al., Magnetic resonance fingerprinting, Nature, 495(7440):187-92 (2013).

* cited by examiner

*Primary Examiner* — Gregory H Curran
(74) *Attorney, Agent, or Firm* — MARSHALL, GERSTEIN & BORUN LLP

(57) ABSTRACT

Methods and systems perform magnetic resonance fingerprinting (MRF) by obtaining scan data of a sample at a low-resolution over a k-space and obtaining other scan data at a high-resolution over the k-space. This scan data may be captured over the same regions, different regions, or where one scan data is captured over a sub-region of the other. The low-resolution and high-resolution scanning is repeated according to a scanning ratio between the first scan data and the second scan data to generate interleaved low-resolution and high-resolution scan data. From that interleaved low-resolution and high-resolution scan data, high-resolution tissue property maps of the sample are generated.

24 Claims, 8 Drawing Sheets
(5 of 8 Drawing Sheet(s) Filed in Color)

(b)
TR 1: Spiral 1, Arm 1
TR 2: Spiral 1, Arm 2
TR 3: Spiral 2, Arm 1
TR 4: Spiral 1, Arm 3
TR 5: Spiral 1, Arm 4
TR 6: Spiral 2, Arm 2
*FIG. 2B*
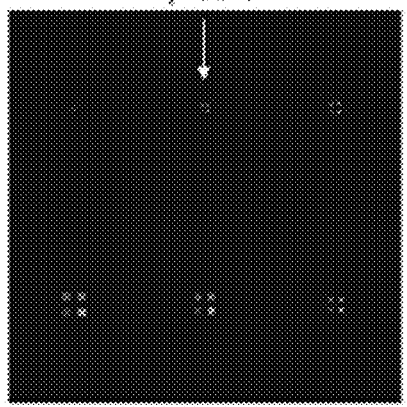 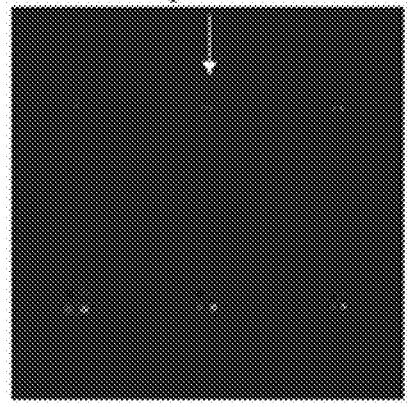
*FIG. 2C*

(a)

| % High Resolution Data | Total Data Acquisition Time (s) |
|---|---|
| 0 | 5.4 |
| 20 | 5.94 |
| 25 | 6.08 |
| 33 | 6.30 |
| 50 | 6.75 |
| 100 | 8.1 |

| Object Width (pixels) | FWHM (pixels) | Nominal $T_1$ (ms) | Measured $T_1$ (ms) | Nominal $T_2$ (ms) | Measured $T_2$ (ms) |
|---|---|---|---|---|---|
| 1 | 1.44 | 1550 | 1120 ± 0 | 275 | 240 ± 0 |
| 2 | 2.17 | 1550 | 1530 ± 20 | 275 | 267.5 ± 5 |
| 3 | 3.12 | 1550 | 1493.3 ± 116.6 | 275 | 273.3 ± 7.1 |
| 4 | 4.18 | 1550 | 1530 ± 53.7 | 275 | 270 ± 3.65 |
| 5 | 5.08 | 1550 | 1537.6 ± 64.4 | 275 | 268.8 ± 4.4 |
| 6 | 6.15 | 1550 | 1548.9 ± 34.0 | 275 | 268.8 ± 4.4 |

*FIG. 5B*

MULTIRESOLUTION MAGNETIC RESONANCE FINGERPRINTING SYSTEMS AND METHODS

FIELD OF THE DISCLOSURE

The invention generally relates to magnetic resonance fingerprinting techniques and, more particularly, to generating quantitative tissue property maps using magnetic resonance fingerprinting techniques.

BACKGROUND

The background description provided herein is for the purpose of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

Magnetic resonance fingerprinting (MRF) is an imaging technique that yields quantitative maps of multiple tissue properties from a single rapid acquisition. Typically, high-resolution property maps require acquisition patterns that collect high spatial resolution data, or a larger extent of k-space. These acquisition patterns require more data sampling time, thereby extending the scan time. However, the individual images used for MRF contain only a fraction of the total k-space data and, therefore, high spatial resolution data may not need to be acquired at every time point to enable higher resolution mapping.

There is a need for improved techniques for MRF imaging that more efficiently collect k-space data.

SUMMARY OF THE INVENTION

In an aspect, the present techniques include systems and methods for combining of low-resolution data and high-resolution data to generate high-resolution maps with a smaller increase in scan time as compared to the collection of all high-resolution data.

In an aspect, a method for performing magnetic resonance fingerprinting (MRF) includes: (a) obtaining, using a magnetic resonance scanning device, a first scan data of a sample at a low-resolution and of a first region in k-space; (b) obtaining, using a magnetic resonance scanning device, a second scan data of a sample at a high-resolution and of a second region in the k-space; repeating (a) and/or (b) according to a scanning ratio between the first scan data and the second scan data to generate interleaved low-resolution and high-resolution scan data; and from the interleaved low-resolution and high-resolution scan data, generating high-resolution tissue property maps of the sample.

In an aspect, the method includes: obtaining the first scan data of the first region in the k-space using a geometric scan pattern scanned at the lower resolution; and obtaining the second scan data of the second region in the k-space using the geometric scan pattern scanned at the higher resolution.

In an aspect, the geometric scan pattern is selected from the group consisting of a spiral pattern, a radial line pattern, a rosette pattern, or a rectilinear scanning pattern.

In an aspect, the first scan data is obtained using a lower undersampling factor in a central region of the first region of the k-space and a higher undersampling factor in a peripheral region of the first region of the k-space.

In an aspect, the second scan data is obtained using a uniform undersampling factor over the second region of the k-space.

In an aspect, the first scan data and/or the second scan data has a uniform sampling density.

In an aspect, the first scan data and/or the second scan data has a varying sampling density.

In an aspect, generating high-resolution tissue property maps of the sample comprises generating $T_1$ tissue property maps and $T_2$ tissue property maps.

In an aspect, generating high-resolution tissue property maps of the sample comprises: performing a first fast Fourier transform with zero-padding on the first scan data; and performing a second fast Fourier transform on the second scan data.

In an aspect, the scanning ratio between the first scan data and the second scan data is 2-to-1, 3-to-1, 4-to-1, or 1-to-1.

In an aspect, the first region of the k-space is a subset of the second region of the k-space.

In another aspect, a non-transitory computer-readable storage medium storing executable instructions that, when executed by a processor, cause a computer to: (a) obtain, using a magnetic resonance scanning device, a first scan data of a sample at a low-resolution and of a first region in k-space; (b) obtain, using a magnetic resonance scanning device, a second scan data of a sample at a high-resolution and of a second region in the k-space; repeat (a) and/or (b) according to a scanning ratio between the first scan data and the second scan data to generate interleaved low-resolution and high-resolution scan data; and from the interleaved low-resolution and high-resolution scan data, generate high-resolution tissue property maps of the sample.

In an aspect, the computer-readable storage medium stores executable instructions that, when executed by a processor, cause a computer to: obtain the first scan data of the first region in the k-space using a geometric scan pattern scanned at the lower resolution; and obtain the second scan data of the second region in the k-space using the geometric scan pattern scanned at the higher resolution.

In an aspect, the geometric scan pattern is selected from the group consisting of a spiral pattern, a radial line pattern, a rosette pattern, or a rectilinear scanning pattern.

In an aspect, the computer-readable storage medium stores executable instructions that, when executed by a processor, cause a computer to obtain the first scan data using a lower undersampling factor in a central region of the first region of the k-space and a higher undersampling factor in a peripheral region of the first region of the k-space.

In an aspect, the computer-readable storage medium stores executable instructions that, when executed by a processor, cause a computer to obtain the second scan data using a uniform undersampling factor over the second region of the k-space.

In an aspect, the first scan data and/or the second scan data has a uniform sampling density.

In an aspect, the first scan data and/or the second scan data has a varying sampling density.

In an aspect, the computer-readable storage medium stores executable instructions that, when executed by a processor, cause a computer to generate $T_1$ tissue property maps and $T_2$ tissue property maps as the high-resolution tissue property maps.

In an aspect, the computer-readable storage medium stores executable instructions that, when executed by a processor, cause a computer to: perform a first fast Fourier transform with zero-padding on the first scan data; and perform a second fast Fourier transform on the second scan data.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The figures described below depict various aspects of the system and methods disclosed herein. It should be understood that each figure depicts an embodiment of a particular aspect of the disclosed system and methods, and that each of the figures is intended to accord with a possible embodiment thereof. Further, wherever possible, the following description refers to the reference numerals included in the following figures, in which features depicted in multiple figures are designated with consistent reference numerals.

FIG. 2B illustrates a spiral sampling scheme for a particular scanning ratio between high-resolution scans and low-resolution scans, in accordance with an example. FIG. 2C are $T_1$ and $T_2$ tissue maps from a scanned phantom, in accordance with an example implementation of the process of FIG. 2A.

FIG. 5A presents data acquisition times for an example MRF sequence when different scanning ratios of low-resolution scan data to high-resolution scan data are collected. FIG. 5B presents measured full-width half max (FWHM), $T_1$, and $T_2$ values (reported as mean±standard deviation) for the lower right square in each cluster of the resolution phantom of FIG. 4, when 33% high-resolution data is acquired. The bold rows in both tables correspond to the images shown in FIGS. 3A, 3B, and 4.

DETAILED DESCRIPTION

The present techniques provide methods and systems for performing magnetic resonance fingerprinting (MRF) by collecting a combination of low-resolution data and high-resolution data to yield high-resolution tissue property maps with a much shorter acquisition time than when collecting all high-resolution data. Different collection patterns and timing between low-resolution data collection and high-resolution data collection yields accurate property value determinations with minimal resolution loss.

In some examples, the methods and systems herein, for example, obtain, using a magnetic resonance scanning device, first scan data of a sample at a low-resolution and of a first region in k-space and obtain second scan data of a sample at a high-resolution and of a second region in the k-space. These patterns of the scan data collection can be selected to optimize between acquisition time and scan quality. The low-resolution and high-resolution scans may be repeated according to a scanning ratio to generate interleaved low-resolution and high-resolution scan data. From that interleaved low-resolution and high-resolution scan data, high-resolution tissue property maps of the sample are thus generated.

Figure 1:
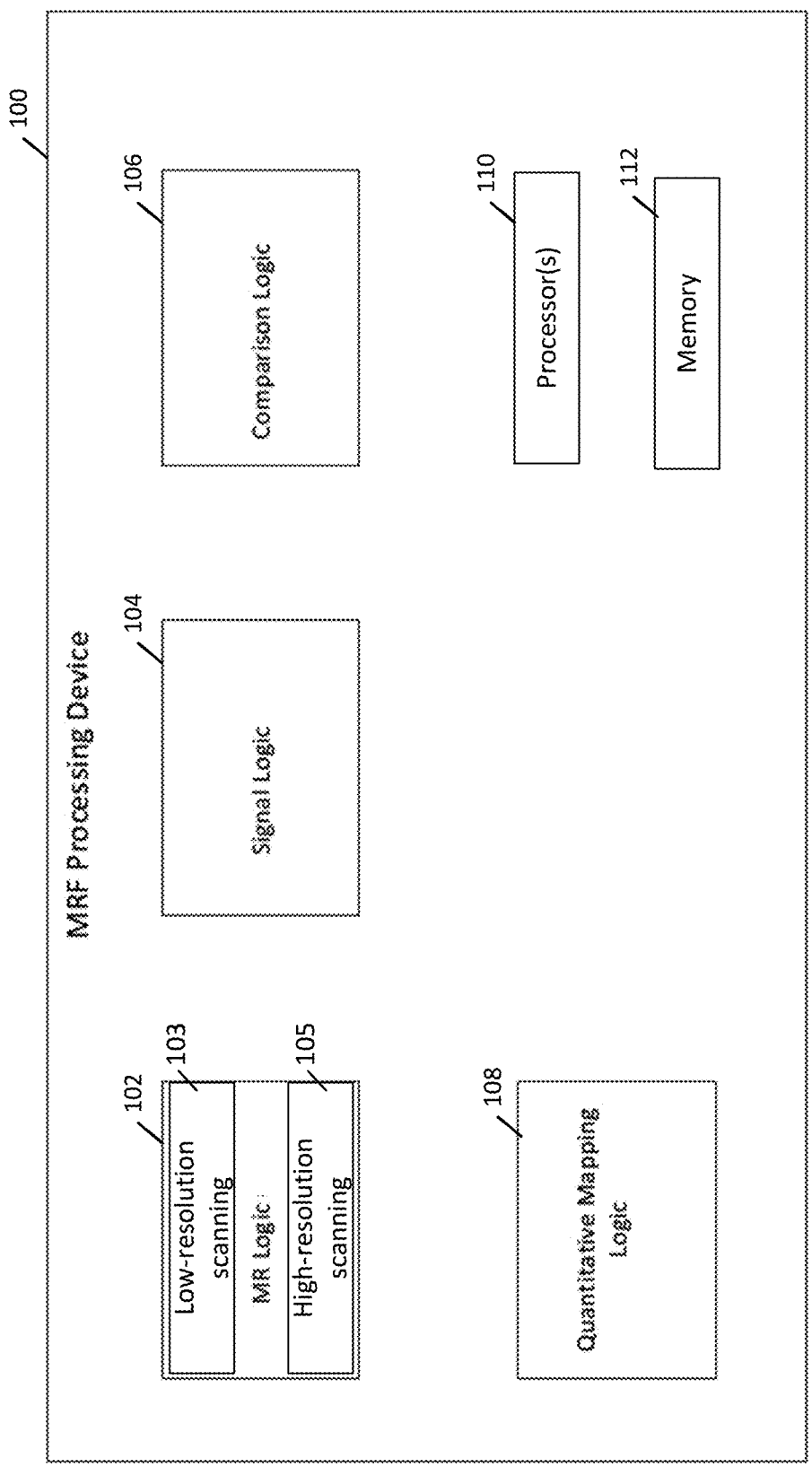
FIG. 1 illustrates an example multiresolution magnetic resonance fingerprinting (MRF) processing device, in accordance with an example herein.

In FIG. 1, a MRF processing device 100 is provided for analyzing MR images, and includes one or more logic modules 102, 104, 106, 108, and/or 110, and that represents an implementation of the MRF acquisition system 102. Depending on the implementation, the logic modules 102, 104, 106, 108, and/or 110 may be implemented in the MRF processing device 100 as hardware, software, firmware, or some combination of such. MRF processing device 100 simultaneously quantifies MR parameters including $T_1$, $T_2$, and proton density for an object to which the MRF processing device 100 applies an MRF pulse sequence. In one embodiment, MRF processing device 100 provides an MR image that facilitates identifying certain tissues based on their relative hypo-intense or hyper-intense appearance on an MR image (e.g., $T_1$ weighted image, $T_2$ weighted image).

MRF processing device 100 includes an MR logic module 102. The MR logic module 102 repetitively and variably samples an object in a (k, t, E) space to acquire a set of MR signals that may have non-constant amplitude and/or phase. For the (k, t, E) space, the k may be a point in k-space representing a spatial frequency of an MR image. In some implementations, the MR logic 102 may determine the value of k based on a Fourier Transform (FT) of the MR image. The tin the (k, t, E) space represents time, and the E represents one or more MR parameters for the MR image in question. Members of the set of MR signals are associated with different points in the (k, t, E) space. In different examples, the different points are sampled according to a plan where t and/or E varies non-linearly and/or in a non-constant manner.

The MR logic module 102 may sample the object using an MR pulse sequence containing at least one variable sequence block. Each sequence block contains an excitation phase, a readout phase, and a waiting phase, and the duration of the sequence block is referred to as the repetition time (TR). The excitation phase applies radiofrequency (RF) energy to a volume of one or more resonant species. The readout phase samples the signal resulting from the excitation phase simultaneously for all resonant species. The waiting phase is a pause before the beginning of the next sequence blocks. The MR logic module 102 includes low-resolution scanning logic 103 and a high-resolution scanning logic 105, each of which may be configured to employ a different resolution and sampling patterns during the readout phases of the pulse sequence block, in accordance with the processes and methods herein. In some implementations, the signal from resonant species is acquired using a variable density spiral-out trajectory. In further implementations, one signal may be more attuned with either of the $T_1$ tissue map or the $T_2$ tissue map. For example, the signal may be more $T_1$-weighted and the echo signal may be more $T_2$-weighted. In still further implementations, the MR logic module 102 may insert a mono-polar diffusion gradient in the excitation and readout phases. Inserting the mono-polar diffusion gradient may increase the diffusion sensitivity of the pulse sequence. In some examples, the MR logic module 102 may acquire the signal with sequence blocks of varying RF excitation energy, varying repetition times, varying waiting times, varying diffusion gradient moments, and varying readout parameters. Readout parameters include the sampling pattern, sampling density, and extent of k-space covered. (Examples of pulse sequences include steady state free precession and balanced steady state free precession).

In an example, the low-resolution scanning logic 103 and the high-resolution scanning logic 105 are configured to obtain a first scan data of a sample at a low-resolution and of a first region in k-space and a second scan data of a sample at a high-resolution and of a second region in the k-space, respectively. In examples, the MR logic 102 is further configured to repeat these low-resolution and high-resolution according to a scanning ratio between the first scan data and the second scan data, generating interleaved low-resolution and high-resolution scan data. From there, and as further discussed in examples below, a quantitative mapping logic 108 generates, from the interleaved low-resolution and high-resolution scan data, high-resolution tissue property maps of the sample.

In the illustrated example, the MRF processing device 100 also includes a signal logic module 104. Signal logic module 104 produces an MR signal evolution from the acquired MR signals from the MR logic 102. The signal evolution may include a number of MR signals (both low-resolution and high-resolution scan data) acquired over a period of time. The set of MR signals may include transient-state signals associated with the MRF pulse sequence, a free induction decay signal, and a spin echo signal. The comparison logic module 106 compares reference information with the produced MR signal evolution or information associated with the produced MR signal evolution, for both the low-resolution and high-resolution scan data. In some implementations, the comparison logic module 106 determines whether a match exists between signals included in the reference information and at least one of the produced MR signal evolution or information associated with the produced MR signal evolution based on whether the comparison logic module 106 determines there to be an exact match. In other implementations, an exact match is not necessary, and the comparison logic module 106 may determine that there exists a match where signals are similar. Depending on the implementation, a match may be the signal that most closely matches another signal and/or the first signal that matches another signal to within a threshold. A match may be found by template matching, pattern matching, or other comparison approaches. The reference information may be, for example, a previously acquired signal evolution, a simulated signal evolution, an item derived from a signal evolution other than the produced MR signal evolution, and/or any other similar information. The reference information may include signal evolutions from different tissue types (e.g., healthy, diseased, advanced disease, etc.). Further this reference information may be captured at a low-resolution or a high-resolution or some combination thereof.

To generate MRF tissue maps, the MRF processing device 100 also includes the quantitative mapping logic module 108 configured to generate, from the interleaved low-resolution and high-resolution scan data captured at MR logic 102, high-resolution tissue property maps of the sample, in accordance with techniques herein. The quantitative mapping logic module 108 may produce one or more quantitative maps of tissue properties associated with the object being scanned, for example, quantitative maps for $T_1$, $T_2$, proton density, and diffusion, based at least in part on the stored signal evolution that matches the MR signal evolution. The MR parameters may be retrieved from a data store that links stored MR parameters to the reference information. Quantitative mapping logic module 108 may also display the quantitative maps or cause the quantitative maps to be displayed. In some examples, multiple tissue property maps are generated simultaneously by the module 108.

Figure 2A:
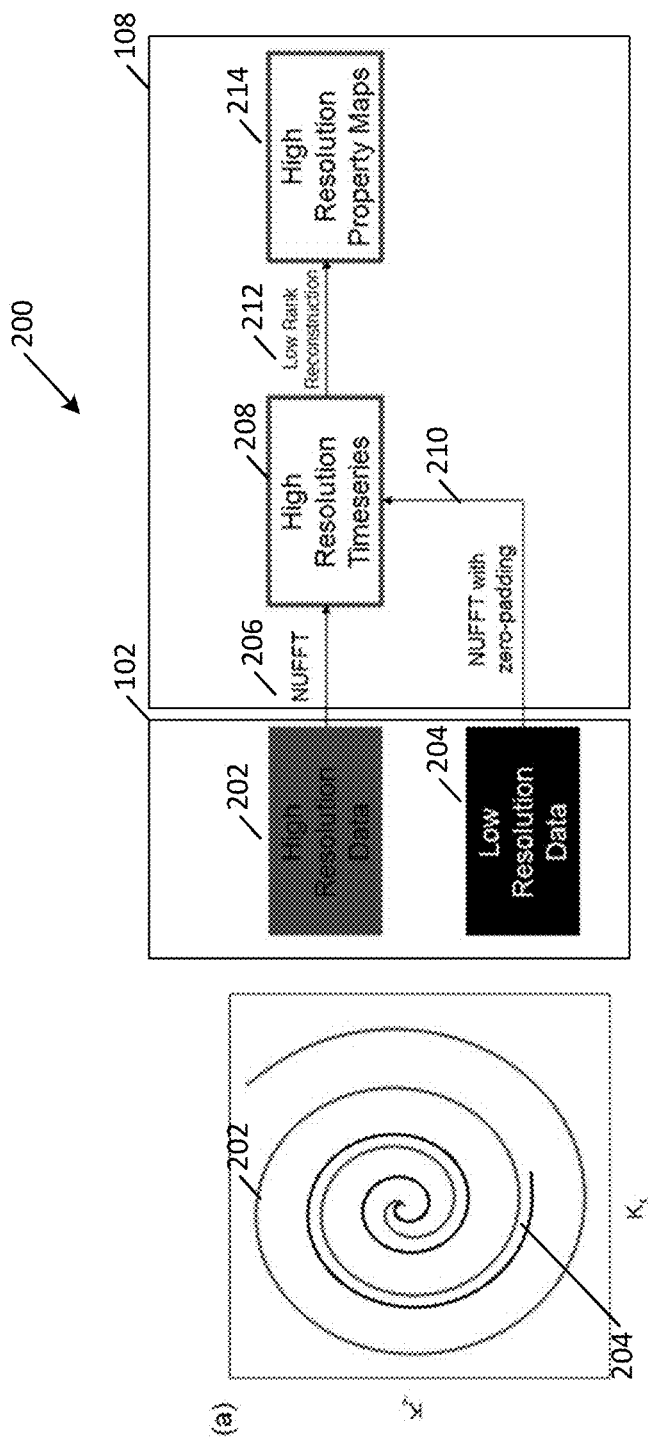
FIG. 2A is illustrates a process for multiresolution MRF as may be performed by the device of FIG. 1, to generate high resolution tissue maps from capture low-resolution and high-resolution scan data.

FIG. 2A illustrates an example method 200 to generate high-resolution property maps, in an example. A sample is scanned using a MRF device, and the MR logic 102 captures high-resolution scan data 202 and low-resolution scan data 204 using different scanning parameters. The scan data 202 and 204 may be captured at a uniform sampling density or at a varying sampling density. In some examples, the first scan data 204 is obtained over a first region in k-space using a geometric scan pattern scanned at a lower resolution. As used herein a "lower resolution" or "lower spatial resolution" refers to spatial frequencies corresponding to pixels of 1.5 mm×1.5 mm or larger. Similarly, the scan data 202 is obtained of a second region in the k-space using the geometric scan pattern scanned at a higher resolution. As used herein a "higher resolution" or "higher spatial resolution" refers to spatial frequencies corresponding to pixels less than 1.5 mm×1.5 mm or smaller, for example 1 mm×1 mm or smaller. As times, references may be made to "approximately", as in approximately 1.5 mm×1.5 mm, and such references are intended to include +10%/-10%.

The scan patterns shown in FIG. 2A for each data 202/204 are spiral patterns. Any suitable scan pattern may be used to collectively scan the entire sample or a substantial portion thereof. Example geometric scan patterns for the scan data 202 and 204 include spiral pattern, a radial line pattern, a rosette pattern, or a rectilinear scanning pattern. In some examples, the MR logic 102 is configured to obtain the scan data 204 using a lower undersampling factor in a central region of the first region of the k-space and a higher undersampling factor in a peripheral region of the first region of the k-space. For example, this may be performed by the low-resolution scanning logic 103. Similarly, the MR logic 102 is configured to obtain the scan data 202 using a uniform undersampling factor over the second region of the k-space, for example, using the high-resolution scanning logic 105. These scan data 202 and 204 are collected according to a scanning ratio. The undersampling factor, that is, the ratio of the number of data points required for a fully sampled acquisition according to the Nyquist sampling theorem, to the number of data points acquired in the undersampled acquisition, can be defined globally for a MRF scan or, in the case of variable density spirals, the undersampling factor may be defined locally. In some examples, the lower-resolution scan data is captured over a first region of the k-space that is a subset of the second region of the k-space captured at the higher-resolution. In some examples, including that shown in FIG. 2A, the lower-resolution scanned region of the k-space is smaller than the higher-resolution scanned region of the k-space, and the two regions are different. In the illustrated example, each region is scanned using a spiral pattern, but the two spiral patterns are slightly offset. The first region comprises different locations in the k-space from the second region.

FIG. 2B illustrates an example sampling scheme for capturing 33% high-resolution data 202 and 67% low-resolution data 204 (or a 2-to-1 low-to-high scanning ratio), where spiral 1 is the low-resolution spiral and spiral 2 is the high-resolution spiral. Any number of scanning ratios between the low-resolution and the high-resolution scan data may be obtained. Example scanning ratios between the between the first scan data and the second scan data is 2-to-1, 3-to-1, 4-to-1, or 1-to-1. FIG. 2C illustrates example $T_1$ Map and $T_2$ map of a resolution phantom sample scanned using the process 200. Each cluster included 4 squares with different $T_1$ and $T_2$ values, and ranged in size from 1×1 to 6×6 pixels. The white arrow denotes the 2×2 pixel cluster used in FIGS. 3A, 3B, 4, and 5.

In the example of FIG. 2A, the high-resolution scan data 202 and the low-resolution scan data 204 obtained by the MR logic 102 are provided to the quantitative mapping logic 108 for analysis (the processing of the signal logic 104 and comparison logic 106 are not shown in this example). In the logic 108 a non-uniform fast Fourier transform (NUFFT) 206 was applied to the spiral scan data 202 to grid the spiral k-space data to yield a time series of undersampled images 208. The low-resolution spiral scan data 204 was provided to another non-uniform fast Fourier transform (NUFFT) with zero-padding (210) in k-space to yield a matrix size of 300×300 to match that of the high-resolution data. In an example, for each pulse sequence, a dictionary with 4,966 atoms may be calculated for $T_1$ values and for $T_2$ values. The logic 108 generates the resulting $T_1$ and $T_2$ maps using a low-rank reconstruction 212 followed by inner product matching with the dictionary. The low-rank reconstruction process of 212 may be an iterative image reconstruction process. There is a low-rank constraint that enforces the data is represented by a small number of wavelet coefficients. This low-rank constraint can be adjusted to tune between data accuracy and noise/artifact suppression, improving the image quality despite noise and artifacts present in the original data. The low-rank reconstruction 212 is an optional reconstruction process and can be replaced with other techniques or eliminated.

While comparison logic module 106 and quantitative logic module 108 are illustrated as being part of MRF processing device 100, in some examples, the comparison logic module 106 and quantitative mapping logic module 108 may reside in an apparatus separate from the MRF processing device 100. In such examples, MRF processing device 100 may provide MR signals to the separate apparatus housing comparison logic module 106 or quantitative mapping logic module 108. In further examples, comparison logic module 106 and/or quantitative mapping logic module 108 may reside in separate apparatuses.

While shown as separate logic modules 102-108, each of which may be implemented in hardware having one or more processors and memory, in some examples, the MRF processing device 100 is implemented having one or more processors 110 that may implement the operation of the logic modules 102-108. Further the processing device 100 may have a computer-readable memory 112 having instructions that may be executed by the one or more processors 112 and/or logic modules 102-108 to perform the methods and processes described herein.

Example

In an example implementation of the device 100, we applied the multiresolution process 200 to a two-dimensional (2D) fast imaging with steady-state precession (FISP) MRF sequence with 1000 repetition times (TRs) and an initial adiabatic inversion. The process 200 was configured to capture two 48-arm spirals with FOV=300 mm: (1) a lower resolution variable density spiral (scan data 204) with an undersampling factor of 24 in the central 25% of k-space and an undersampling factor of 48 at the periphery of k-space, matrix size 192×192, resolution 1.6×1.6 mm$^2$, readout duration 2.9 ms, and minimum TR 5.4 ms; and (2) a higher resolution uniform density spiral (scan data 202) with an undersampling factor of 48, matrix size 300×300, resolution 1.0×1.0 mm$^2$, readout duration 5.6 ms, and minimum TR 8.1 ms. During the MRF acquisition, the low- and high-resolution spirals were interleaved, and the number of higher resolution spirals varied to assess the effect on image resolution. FIG. 2B shows the sample scheme used, where 33% of the MRF images (i.e., every third TR) are collected using the high-resolution spiral, and the remaining images are captured using the low-resolution spiral. As illustrated in FIG. 2A, a non-uniform fast Fourier transform (NUFFT) was used to grid the spiral k-space data to yield a time series of undersampled images. The low-resolution spiral data were zero-padded in k-space to yield a matrix size of 300×300 to match that of the high-resolution data. For each pulse sequence, a dictionary with 4,966 atoms was calculated for $T_1$ values [10:10:90, 100:20:1000, 1040:40:2000, 2050:50:3000] and $T_2$ values [2:2:8, 10:5:100, 110:10:300, 350:50:1100], where these expressions are represented in the form of [min:step size:max, . . . ], concatenating multiple number series. The resulting $T_1$ and $T_2$ maps were generated using a low-rank reconstruction followed by inner product matching with the dictionary.

In this example, we evaluated two simulation experiments. In a first simulation, a resolution phantom was generated as shown in FIG. 2C with a matrix size of 300×300. The phantom contained six clusters of four equal-sized squares with widths ranging from one to six pixels, each with different $T_1$ and $T_2$ values; the surrounding pixels were set to $T_1$=250 ms, $T_2$=68 ms. Six different acquisition schemes were simulated, where a different fraction of MRF time points were sampled using the high-resolution spiral (100%, 50%, 33%, 25%, 20%, and 0%). All acquisitions employed 1000 TRs; however, the total scan times varied due to the differences in spiral readout duration. Maps were assessed by measuring the mean $T_1$ and $T_2$ values from each square in the 2×2 square cluster and the 10×10 pixel surrounding background. For the 33% mixed-resolution sequence, the $T_1$ and $T_2$ values and full-width at half-maximum (FWHM) were measured for one square of each size cluster to quantify spatial blurring. In a second simulation, to assess the sensitivity to o$_{ff}$-resonance blurring, a FWHM of the point spread function (PSF) for all six acquisition schemes was calculated from the sum of the undersampled MRF images over time using a point object phantom (assuming infinite relaxation times) for o$_{ff}$-resonance values of 0 Hz, 50 Hz, and 150 Hz.

Figure 3A:
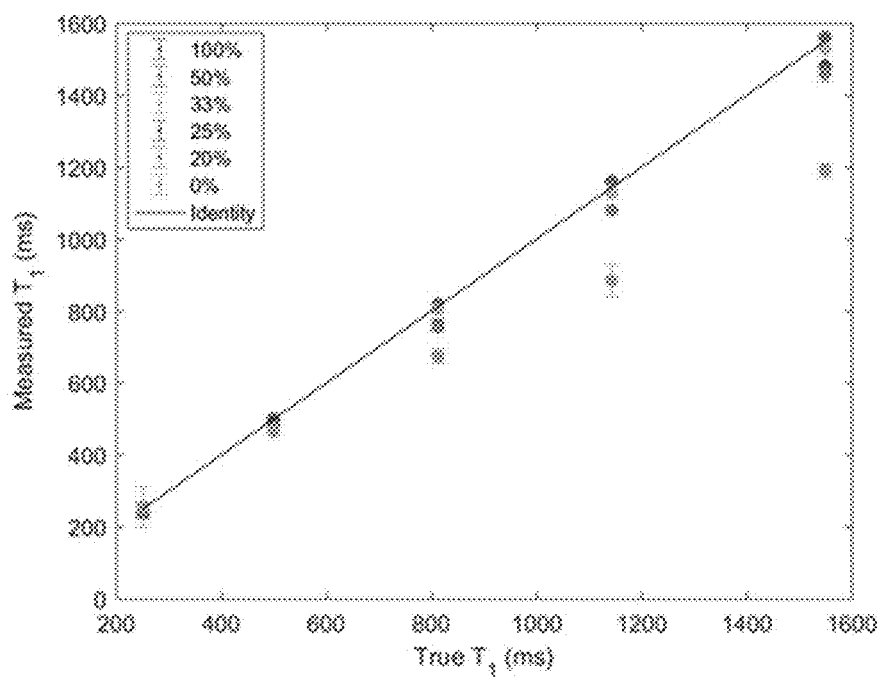
FIGS. 3A and 3B are plots of measured versus nominal $T_1$ (FIG. 3A) and $T_2$ (FIG. 3B) values (mean±standard deviation) for resolution phantom property maps reconstructed using different scanning ratios of low-resolution scan data to high-resolution scan data, in accordance with an example.
Figure 3B:
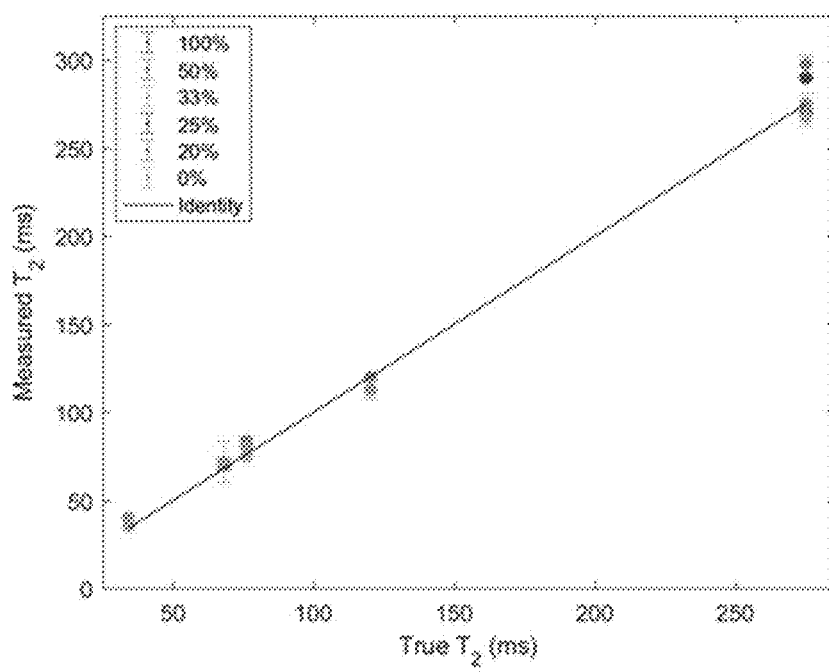
Figure 4:
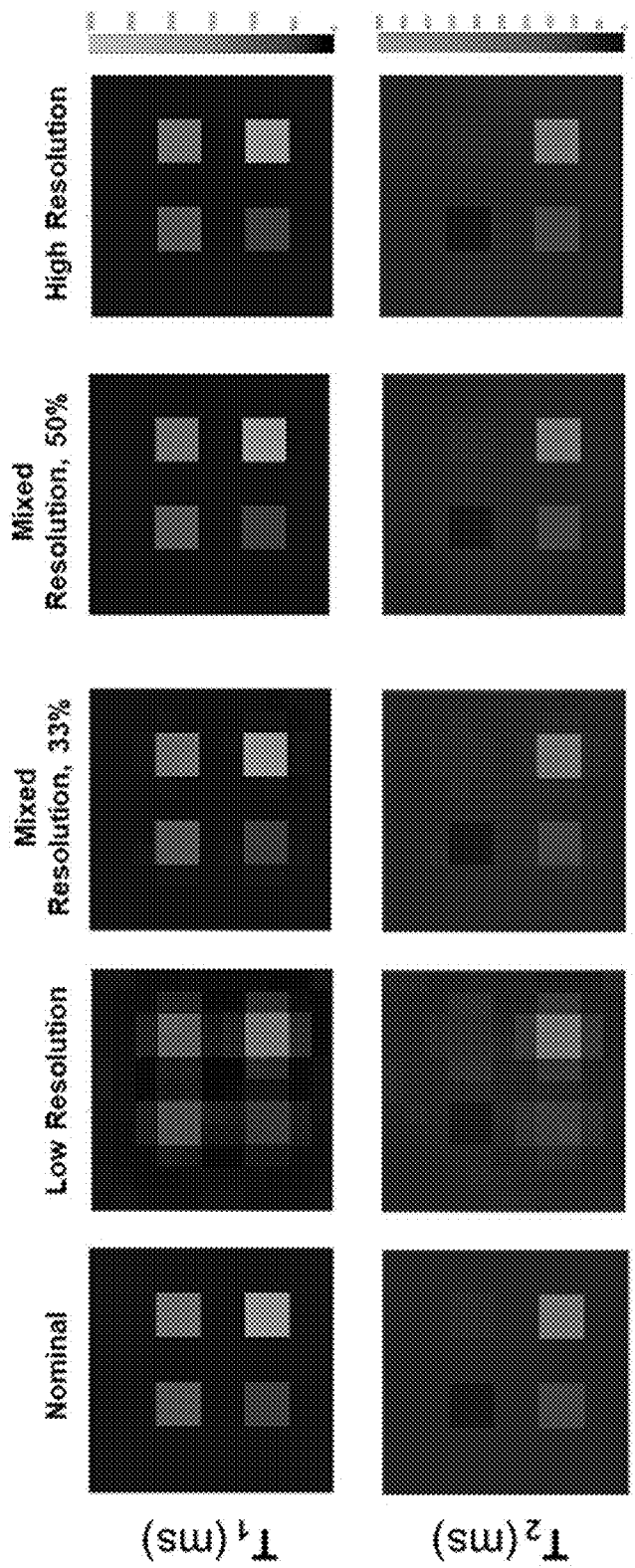
FIG. 4 are images of multiresolution MRF results for 2×2 pixel squares of a resolution phantom, in accordance with an example implementation of the process of FIG. 2A.

The simulation results are shown in FIGS. 3-5. As shown in the comparison data of FIG. 5A, high-resolution 1.0×1.0 mm$^2$ MRF maps can be collected in 22% less time (6.3 seconds) using the proposed mixed-resolution spiral sampling compared to a conventional high-resolution spiral trajectory (8.1 seconds). For example, acquiring at least 33% of the data at high-resolution yields accurate $T_1$ and $T_2$ measurements and minimal blurring in small objects, as shown in FIGS. 3, 4, and 5(B). Acquiring less than 33% high-resolution data results in decreased $T_1$ values, as shown in FIG. 3A.

Figure 6A:
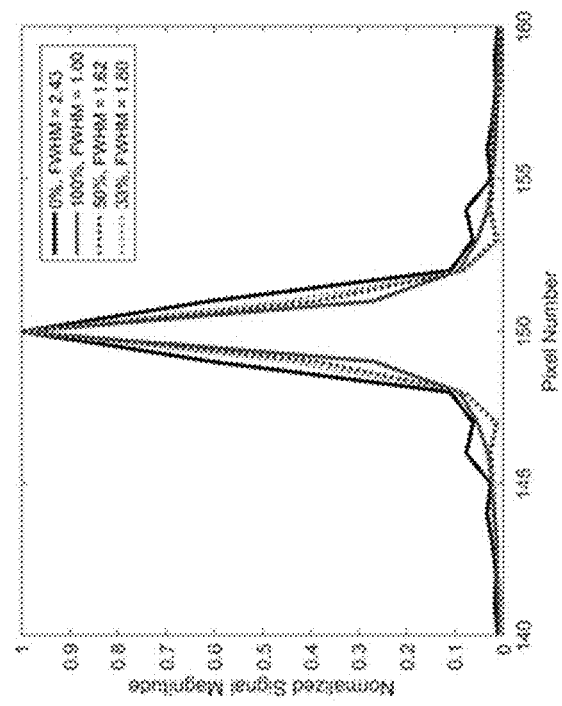
FIGS. 6A-6B are plots of point spread function (PSF) cross-sections and FWHM values (in units of pixels) for a point object phantom, in accordance with an example. Simulations were performed for pulse sequences with 0%, 33%, 50%, and 100% of the MRF time points sampled using the high-resolution spiral. Results are shown for simulations on-resonance FIG. 6A, 50 Hz off-resonance FIG. 6B, and 150 Hz off-resonance FIG. 6C.
Figure 6B:
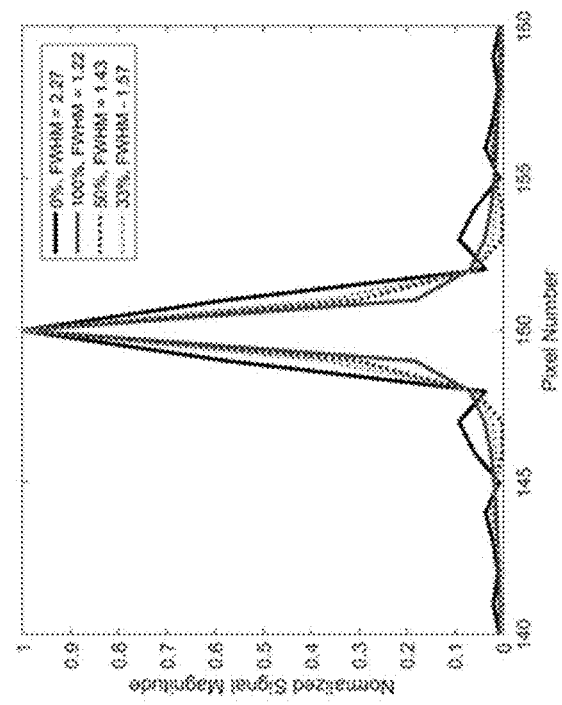
Figure 6C:
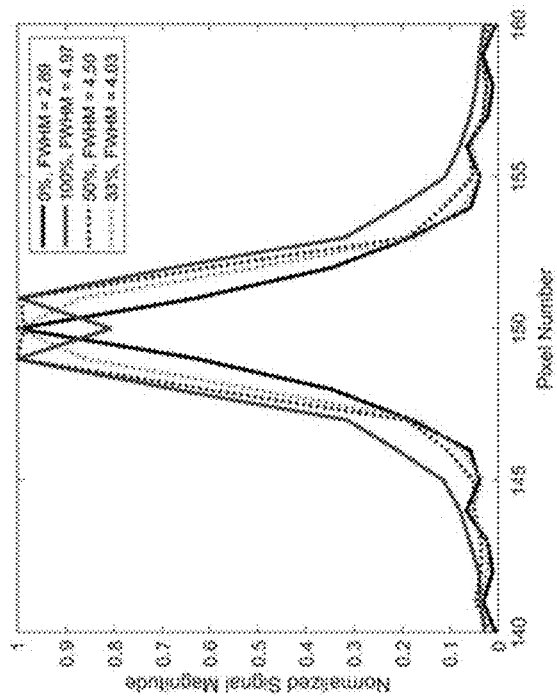

High-resolution spirals with longer durations may cause image blurring in the presence of $o_{ff}$-resonance. FIGS. 6A-6C show the point spread function (PSF) for low-resolution, high-resolution, and mixed-resolution acquisitions at various $o_{ff}$-resonance frequencies. For $o_{ff}$-resonance frequencies close to 0 Hz, the 33% mixed-resolution acquisition provides improved spatial resolution (FWHM=1.57 pixels) compared to the low-resolution acquisition (FWHM=2.27 pixels). At larger $o_{ff}$-resonance frequencies near 150 Hz, the $o_{ff}$-resonance blurring dominates over the gain in nominal spatial resolution; the FWHMs of all scans using the high-resolution acquisition are larger than that of the low-resolution acquisition.

FIG. 4 illustrates 2×2 pixel square images of the resolution phantom, in this example implementation of the multiresolution MRF technique 200. The first column shows the ground truth $T_1$ and $T_2$ maps. The second column shows the results of acquiring low-resolution data and simply zero-padding the images, resulting in significant blurring. The third column shows the results of acquiring 33% of the data with the high-resolution spiral trajectory, in an application of the present techniques. The fourth column shows the result of acquiring 50% of the data with the high-resolution spiral trajectory, in an application of the present techniques. The fourth column shows the result of acquiring all data with the high-resolution spiral.

Figure 7:
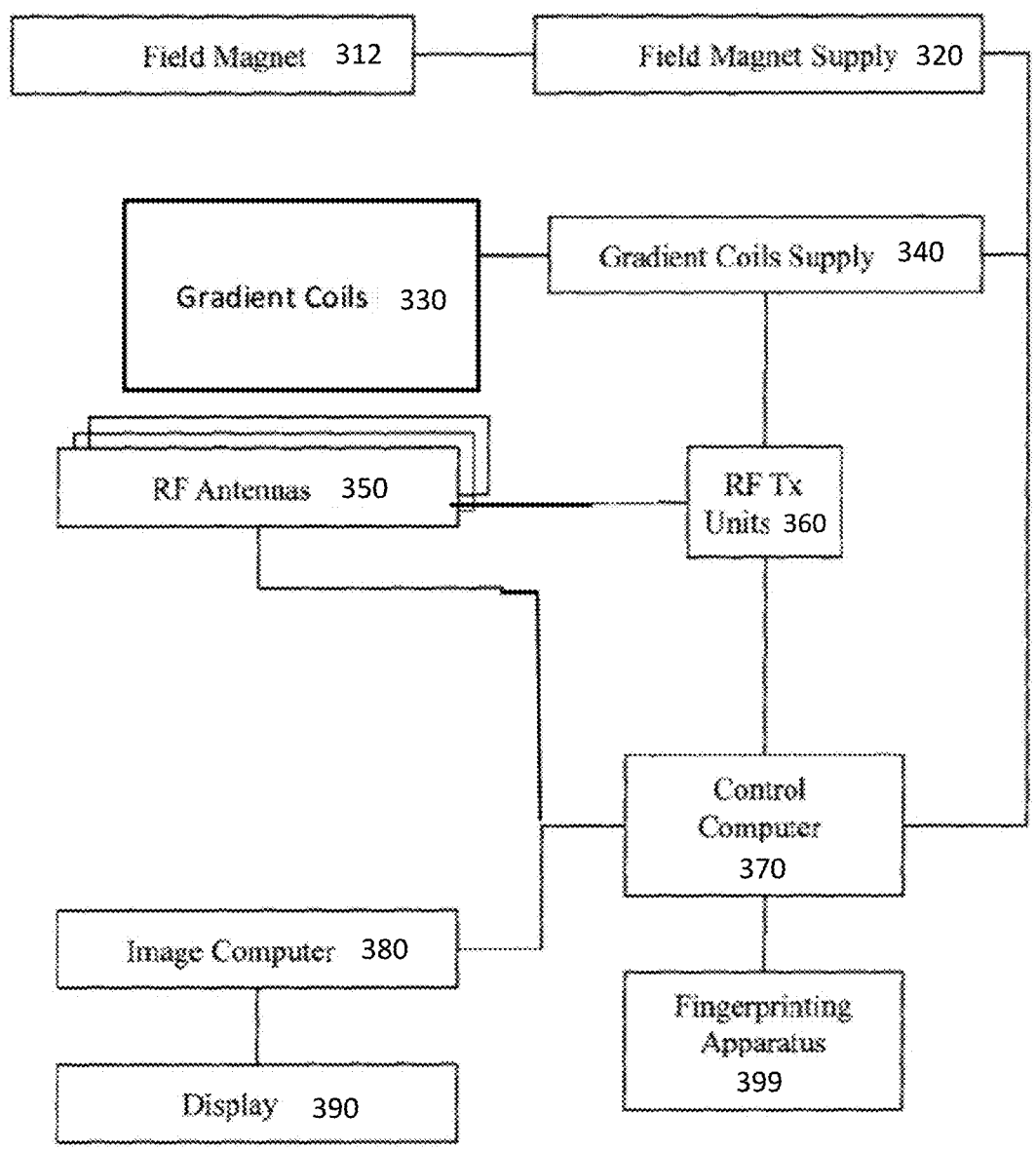
FIG. 7 illustrates an example MRF system which may include the MRF processing device of FIG. 1 and in which the techniques of FIG. 2A may be implemented, in accordance with an example.

Referring next to FIG. 7, MRF system 300 is an example MR system configured with a fingerprinting apparatus 399 to facilitate MR fingerprinting, and as may be implemented as the multiresolution MRF device 100. Depending on the implementation, the fingerprinting apparatus 399 is and/or includes elements of MRF processing device 100 as described with regard to FIG. 1. In further implementations, the fingerprinting apparatus 399 performs example methods such as example method 200 as described above. While fingerprinting apparatus 399 is illustrated as part of MRF system 300 in one example, fingerprinting apparatus 399 may be a separate apparatus or apparatuses.

The system 300 includes one or more field magnets 310 and a field magnet supply 320. In some implementations, the field magnets 310 produce a uniform $B_0$ field—i.e. the main static magnetic field of the MRF system 300. However, in other implementations, the $B_0$ field is not uniform. In such implementations, the magnetic field instead varies over an object that the MRF system 300 analyzes. MRF system 300 further includes gradient coils 330 configured to emit gradient magnetic fields. The gradient coils 330 may be controlled, at least in part, by a gradient coil supply 340. In some implementations, the timing, strength, and orientation of the gradient magnetic fields may be controlled, and thus selectively adapted, during an MR procedure. As described above, the gradient coils 330 may commonly correlate signals with each other. As such, in some implementations, the system 300 may mistake noise from multiple coils as being an actual signal, resulting in skewed denoising. In such implementations, to counter such correlation, the system 300 performs a decorrelation procedure before performing the techniques described in FIGS. 2-5. The decorrelation procedure may be a pre-whitening procedure, an extraction procedure, or any other similar procedure as known in the art.

In some implementations, MRF system 300 includes a set of RF antennas 350 that generate RF pulses and receive resulting MR signals from an object that the MRF system 300 scans—i.e. the object to which the RF antennas 350 direct the RF pulses. That is the RF antennas 350 are controlled to direct the RF pulses in accordance with the low-resolution and high-resolution scanning described herein. In further implementations, the MRF system 300 controls how the pulses are generated and how the resulting MR signals (e.g., the low-resolution scan data and the high-resolution scan data) are received. As such, the MRF system 300 may selectively adapt both operations during an MR procedure. In some implementations, the RF antennas 350 employs separate RF transmission and reception coils. Similarly, the RF antennas 350 may be controlled at least in part by a set of RF transmission units 360.

In some implementations, a control computer 370 controls some or all of the field magnet supply 320, the gradient coils supply 340, and/or the RF transmission units 360, for example to affect the multiresolution processes and methods herein. In further implementations, the control computer 370 is further programmed to control an MR device such as MRF processing device 100. In other implementations, control computer 370 is or includes elements of MRF processing device 100. Conventionally, the MRF system 300 employs the MR signals received from the RF antennas 350 to generate an MRF image, and thus may be subject to a transformation process. In some implementations, the transformation process is or is akin to a two dimensional fast Fourier transform (FFT) that generates pixilated image data on each of the low-resolution and high-resolution scan data. Depending on the implementation an image computer 380 may perform the transformation. In other implementations, another, similar processing device performs the image transformation. Depending on the implementation, the display 390 may then display the image data or the resulting high resolution tissue maps. In some implementations, the display 390 may display some or all of the plots described with regard to FIGS. 2-6 above. For example, the display 390 may display any of the images, plots, etc. from FIGS. 2-6.

Fingerprinting apparatus 399 facilitates the unconventional techniques for MR image reconstruction and denoising as described herein. Further, the fingerprinting apparatus 399 facilitates the construction of images from MR signals received from the RF antennas 350, such as $T_1$ and $T_2$ tissue maps. As such, the RF energy applied to an object by system 300 need not be constrained to produce signals with substantially constant amplitudes or phases. Instead, fingerprinting apparatus 399 facilitates matching received signals to known signals for which a reconstruction parameter, relaxation parameter, or other information is already available.

While FIG. 7 illustrates an example MRF system 300 that includes various components connected in various ways, one skilled in the art will appreciate that other MR systems may include other components connected in other ways.

In the foregoing specification, specific examples have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Additionally, the described embodiments/examples/implementations should not be interpreted as mutually exclusive, and should instead be understood as potentially combinable if such combinations are permissive in any way. In other words, any feature disclosed in any of the aforementioned embodiments/examples/implementations may be included in any of the other aforementioned embodiments/examples/implementations.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some examples may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

Moreover, the patent claims at the end of this patent application are not intended to be construed under 35 U.S.C. § 112(f) unless traditional means-plus-function language is expressly recited, such as "means for" or "step for" language being explicitly recited in the claim(s). The systems and methods described herein are directed to an improvement to computer functionality, and improve the functioning of conventional computers.

What is claimed:

1. A method for performing magnetic resonance fingerprinting (MRF), the method comprising:
   (a) obtaining, using a magnetic resonance scanning device, a first scan data of a sample at a low-resolution and of a first region in k-space;
   (b) obtaining, using a magnetic resonance scanning device, a second scan data of a sample at a high-resolution and of a second region in the k-space;
   repeating (a) and/or (b) according to a scanning ratio between the first scan data and the second scan data to generate interleaved low-resolution and high-resolution scan data; and
   from the interleaved low-resolution and high-resolution scan data, generating high-resolution tissue property maps of the sample.

2. The method of claim 1, for performing magnetic resonance fingerprinting (MRF), the method comprising:
   obtaining the first scan data of the first region in the k-space using a geometric scan pattern scanned at the lower resolution; and
   obtaining the second scan data of the second region in the k-space using the geometric scan pattern scanned at the higher resolution.

3. The method of claim 2, wherein the geometric scan pattern is selected from the group consisting of a spiral pattern, a radial line pattern, a rosette pattern, or a rectilinear scanning pattern.

4. The method of claim 3, wherein the first scan data is obtained using a lower undersampling factor in a central region of the first region of the k-space and a higher undersampling factor in a peripheral region of the first region of the k-space.

5. The method of claim 3, wherein the second scan data is obtained using a uniform undersampling factor over the second region of the k-space.

6. The method of claim 1, wherein the first scan data and/or the second scan data has a uniform sampling density.

7. The method of claim 1, wherein the first scan data and/or the second scan data has a varying sampling density.

8. The method of claim 1, wherein generating high-resolution tissue property maps of the sample comprises generating $T_1$ tissue property maps and $T_2$ tissue property maps.

9. The method of claim 1, wherein generating high-resolution tissue property maps of the sample comprises:
performing a first fast Fourier transform with zero-padding on the first scan data; and
performing a second fast Fourier transform on the second scan data.

10. The method of claim 1, wherein the scanning ratio between the first scan data and the second scan data is 2-to-1.

11. The method of claim 1, wherein the scanning ratio between the first scan data and the second scan data is 3-to-1.

12. The method of claim 1, wherein the scanning ratio between the first scan data and the second scan data is 4-to-1.

13. The method of claim 1, wherein the scanning ratio between the first scan data and the second scan data is 1-to-1.

14. The method of claim 1, wherein the first region of the k-space is a subset of the second region of the k-space.

15. The method of claim 1, wherein the first region of the k-space is a smaller than the second region of the k-space, and the first region comprises different locations in the k-space than the second region.

16. A non-transitory computer-readable storage medium storing executable instructions that, when executed by a processor, cause a computer to:
(a) obtain, using a magnetic resonance scanning device, a first scan data of a sample at a low-resolution and of a first region in k-space;
(b) obtain, using a magnetic resonance scanning device, a second scan data of a sample at a high-resolution and of a second region in the k-space;
repeat (a) and/or (b) according to a scanning ratio between the first scan data and the second scan data to generate interleaved low-resolution and high-resolution scan data; and
from the interleaved low-resolution and high-resolution scan data, generate high-resolution tissue property maps of the sample.

17. The computer-readable storage medium of claim 16 storing executable instructions that, when executed by a processor, cause a computer to:
obtain the first scan data of the first region in the k-space using a geometric scan pattern scanned at the lower resolution; and
obtain the second scan data of the second region in the k-space using the geometric scan pattern scanned at the higher resolution.

18. The computer-readable storage medium of claim 17, wherein the geometric scan pattern is selected from the group consisting of a spiral pattern, a radial line pattern, a rosette pattern, or a rectilinear scanning pattern.

19. The computer-readable storage medium of claim 18, storing executable instructions that, when executed by a processor, cause a computer to:
obtain the first scan data using a lower undersampling factor in a central region of the first region of the k-space and a higher undersampling factor in a peripheral region of the first region of the k-space.

20. The computer-readable storage medium of claim 18, storing executable instructions that, when executed by a processor, cause a computer to:
obtain the second scan data using a uniform undersampling factor over the second region of the k-space.

21. The computer-readable storage medium of claim 16, wherein the first scan data and/or the second scan data has a uniform sampling density.

22. The computer-readable storage medium of claim 16, wherein the first scan data and/or the second scan data has a varying sampling density.

23. The computer-readable storage medium of claim 16, storing executable instructions that, when executed by a processor, cause a computer to generate $T_1$ tissue property maps and $T_2$ tissue property maps as the high-resolution tissue property maps.

24. The computer-readable storage medium of claim 16, storing executable instructions that, when executed by a processor, cause a computer to:
perform a first fast Fourier transform with zero-padding on the first scan data; and
perform a second fast Fourier transform on the second scan data.

* * * * *